(12) United States Patent
Kim et al.

(10) Patent No.: US 10,692,837 B1
(45) Date of Patent: Jun. 23, 2020

(54) CHIP PACKAGE ASSEMBLY WITH MODULAR CORE DICE

(71) Applicant: Xilinx, Inc., San Jose, CA (US)

(72) Inventors: Myongseob Kim, Pleasanton, CA (US); Henley Liu, San Jose, CA (US); Cheang-Whang Chang, Mountain View, CA (US); Nui Chong, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/041,530

(22) Filed: Jul. 20, 2018

(51) Int. Cl.
  *H01L 23/544* (2006.01)
  *H01L 25/065* (2006.01)
  *H01L 23/00* (2006.01)
  *H01L 23/31* (2006.01)
  *H01L 25/00* (2006.01)

(52) U.S. Cl.
  CPC ...... *H01L 25/0652* (2013.01); *H01L 23/3157* (2013.01); *H01L 24/17* (2013.01); *H01L 25/50* (2013.01)

(58) Field of Classification Search
  None
  See application file for complete search history.

(56) References Cited

U.S. PATENT DOCUMENTS

| | | | | |
|---|---|---|---|---|
| 2013/0093074 A1* | 4/2013 | Grant | ................. | H01L 25/0655 257/693 |
| 2014/0124956 A1* | 5/2014 | Lee | ........................ | H01L 24/06 257/777 |
| 2014/0203429 A1* | 7/2014 | Yu | ........................... | H01L 21/78 257/737 |

* cited by examiner

*Primary Examiner* — Cuong B Nguyen
(74) *Attorney, Agent, or Firm* — Patterson + Sheridan, LLP (57) ABSTRACT

A chip package assembly and method for fabricating the same are provided which utilize at least one modular core dice to reduce the cost of manufacture. The modular core dice include at least two die disposed on a wafer segment that are separated by a scribe lane. In one example, a chip package assembly is provided that includes an interconnect substrate stacked below a first wafer segment. The first wafer segment has a first die spaced from a second die by a first scribe lane. The interconnect substrate has conductive routing that is electrically connected to the first die and the second die through die connections.

18 Claims, 5 Drawing Sheets

CHIP PACKAGE ASSEMBLY WITH MODULAR CORE DICE

TECHNICAL FIELD

Embodiments of the present invention generally relate to a chip package assembly, and in particular, to chip package assembly comprising at least two integrated circuit (IC) dice disposed on a single wafer segment.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a plurality of integrated circuit (IC) dice to be mounted to a single package substrate. The IC dice may include memory, logic or other IC devices.

The mask cost associated with new die design at advanced technology nodes (7 nm, 5 nm, 3 nm, etc.) is becoming increasingly expensive due to the increased complexity of lithography and the mask making processes. The cost for designing and tape out of a new custom designed IC die is generally over $100,000, and can easily exceed $3,000,000 (USD). For low volume production, even if this cost is not already prohibitively expense, the high cost of design can significantly reduce the return on investment.

Therefore, a need exists for an improved chip package assembly.

SUMMARY

A chip package assembly and method for fabricating the same are provided which utilize modular core dice to reduce the cost of manufacture. A chip package assembly and method for fabricating the same are provided which utilize at least one modular core dice to reduce the cost of manufacture. The modular core dice include at least two die disposed on a wafer segment that are separated by a scribe lane. In one example, a chip package assembly is provided that includes an interconnect substrate stacked below a first wafer segment. The first wafer segment has a first die spaced from a second die by a first scribe lane. The interconnect substrate has conductive routing that is electrically connected to the first die and the second die through die connections.

In another example, a chip package assembly is provided that includes an interconnect substrate, a first wafer segment and a second wafer segment. The first wafer segment has a first die spaced from a second die by a first scribe lane. The second wafer segment is stacked on the first wafer segment and has a first die spaced from a second die by a scribe lane. The first die of the first wafer segment is electrically and mechanically coupled to the first die of the second wafer segment by die connections. The second die of the first wafer segment is electrically and mechanically coupled to the second die of the second wafer segment. The interconnect substrate has conductive routing that is mechanically and electrically connected to the first wafer segment through die connections.

In yet another example, a method of forming a chip package assembly is provided. The method includes stacking a first wafer segment having a first die spaced from a second die by a first scribe lane on an interconnect substrate having conductive routing, the first die and the second die are not directly electrically connected by conductors routed across first the scribe lane. The method further includes forming die connections between the first wafer segment and the conductive routing of the interconnect substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and method for fabricating the same are provided which utilize at least one wafer segment that includes at least two integrated circuit (IC) dice, for example a first die and a second die. A scribe lane is disposed on the wafer segment and spaces the first die from the second die. The dice comprising the wafer segment provide the core, i.e., main, dice that enable the functionality of the chip package assembly. Since the core dies of the wafer segment may be stocked as modular components for fabricating the chip package assembly, only a single mask set needs to be developed to generated an entire product family. The product family is defined by the use of variations of wafer segments having different numbers of dice within a wafer segment, and the number of wafer segments (or other dice) stacked within the chip package assembly. At advanced technology nodes, such as for example 5 nm, 3 nm nodes, etc., using a single mask set provides significant cost savings not only for a particular package assembly, but multiplied across the entire product family. Thus, the use of modular wafer segments having core dies within the chip package assembly substantially reduces the cost of design and manufacture. Additionally, since the modular wafer segments may be carried in inventory, the wafer segments are readily available for fabrication of new chip package assemblies, dramatically reducing the time to manufacture the chip package assembly.

Additionally, the wafer segment may be mounted on an interconnect substrate that provides connections between the dice and other components of the package. Since the interconnect substrate may be fabricated utilizing much less dense conductors fabricated using relatively less expensive technology as compared to the technology utilized for core dies, the interconnect substrate beneficially enables communication with the dice of the wafer segments without adding significant expense. This modular approach to the design and fabrication of the chip package assembly utilizing wafer segments and low cost interconnect substrates dramatically reduces the need for custom design and tapeouts, thereby speeding the time to market at a significant reduction in cost.

Figure 1:
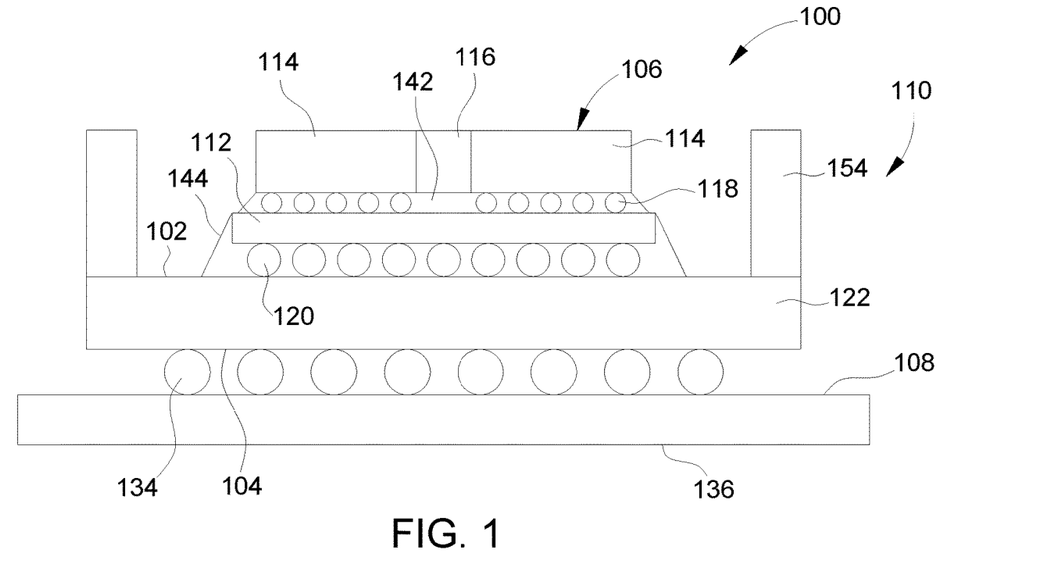
FIG. 1 is a front schematic view of an integrated chip package assembly having a first wafer segment that includes at least two dice.

Turning now to FIG. 1, an exemplary integrated chip package assembly 110 is schematically illustrated disposed on a printed circuit board (PCB) 136. The chip package assembly 110 and printed circuit board (PCB) 136 together form at least part of an electronic device 100. The electronic device 100 may be a tablet, computer, copier, digital camera, smart phone, control system, automated teller machine, server or other solid-state memory and/or logic device.

The chip package assembly 110 includes at least one wafer segment 106 mounted to an interconnect substrate. In FIG. 1, the interconnect substrate is an input/output (I/O) die 112 that is stacked on a package substrate 122. Alternatively, the wafer segment 106 may be stacked on an interconnect substrate in the form of the package substrate 122, without use of an I/O die 112. For example in some implementations, the I/O die 112 may be omitted with wafer segment 106 being connected directly to a top surface 102 of the package substrate 122. In another example, the interconnect substrate. In FIG. 1, the interconnect substrate is an input/output (I/O) die 112 that is stacked on a package substrate 122. Alternatively, the interconnect substrate may be in the form of an interposer stacked between the package substrate 122 and the I/O die 112.

The I/O die 112 generally has a low density (as compared to the die 114) metalized interconnect having solid-state circuitry comprised of routing traces terminating at contact pads. The I/O die 112 may be fabricated on a silicon or other suitable substrate. The I/O die 112 is fabricated utilizing relatively less expensive technology as compared to the die 114, for example, using 65 nm node technology. Thus, the I/O die 112 beneficially enables communication with the dice of the wafer segments without adding significant expense. The contact pads of the I/O die 112 enable signals, such as data, ground and power, to be routed through the I/O die 112 between the package substrate 122 and the dice 114 of the wafer segment 106, as further discussed below with reference to FIG. 3.

Continuing to refer to FIG. 1, a stiffener 154 is optionally coupled to the top surface 102 of the package substrate 122 in a manner that enhances the resistance of the package substrate 122 to out of plane deformation. The stiffener 154 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 154 can also be made of organic materials such as copper-clad laminate. The stiffener 154 is generally positioned at the edge of the package substrate 122 outward of the wafer segment 106.

The wafer segment 106 includes at least two IC dice 114 that are spaced apart by a scribe lane 116. In contrast, conventions dice are separated into individual die prior to assembly in a chip package assembly. In the embodiments described herein, the scribe lane 116 remains intact between dice 114 so that the dice 114 always remain physically connected via the silicon of the wafer segment 106 (i.e., as a unitary structure) even though no conductors are present spanning across the scribe lane 116 and electrically connecting the adjacent dice 114 of the wafer segment 106. Thus, any electrical connections disposed between the dice 114 of the wafer segment 106 are routed outside of the wafer segment 106, such as through the circuitry of the I/O die 112. Although two IC dice 114 are shown in FIG. 1, the number of IC dice 114 may range from two to as many as can be fit on the wafer segment 106.

The I/O die 112, when present, includes circuitry (discussed further below with reference to FIG. 4) for electrically connecting the dice 114 to circuitry of the package substrate 122. The circuitry of the I/O die 112 may optionally include transistors and/or other circuit elements. Solder connections 120, also known as "package bumps" or "C4 bumps," are utilized to provide an electrical connection between the circuitry of the I/O die 112 and the circuitry of the package substrate 122. A bottom surface 104 of the package substrate 122 may be mounted and connected to a top surface 108 of the printed circuit board (PCB) 136, utilizing solder balls 134, wire bonding or other suitable technique. An undermolding 144 may be utilized to fill the space not taken by the solder connections 120 between the PCB 136 and the I/O die 112.

The IC dice 114 are mounted to one or more surfaces of the I/O die 112, or alternatively in implementations wherein an I/O die is not utilized, to the package substrate 122. The IC dice 114 may be programmable logic devices, such as field programmable gate arrays (FPGA), memory devices, optical devices, processors or other IC logic structures. Optical devices include photo-detectors, lasers, optical sources, and the like. In the example depicted in FIG. 1, the IC dice 114 are mounted to a top surface of the I/O die 112 by die connections 118. The die connections 118 may be in the form of a plurality of solder joints, also known as "micro-bumps". Optionally, the die connections 118 may be a hybrid bond that utilizes metals bonding to metals and dielectric bonding to dielectric. The die connections 118 mechanically and electrically connect the circuitry of each IC die 114, and thus the wafer segment 106, to circuitry of the I/O die 112. The circuitry of the I/O die 112 connects the die connections 118 to selective solder connections 120, and hence, connects selective circuitry of each IC die 114 to the package substrate 122, to enable communication of the dice 114 with the PCB 136 after the chip package assembly 110 is mounted within an electronic device (not shown). When the optional I/O die 112 is not present, the die connections 118 connects selective circuitry of each IC die 114 to the package substrate 122 to enable communication of the dice 114 with the PCB 136. An undermolding 142 may be utilized to fill the space not taken by the die connections 118 between the dice 114 and I/O die 112.

As discussed above, the number of IC dice 114 selected to comprise the wafer segment 106 may range from two to as many as can be fit on the wafer segment 106. Generally, it is intended that different wafer segments 106 may be stocked having different numbers of IC dice 114. Thus, when a design for a chip package assembly is contemplated, stocked wafer segments 106 having the desired number of IC dice 114 are readily available for essentially immediate assembly without the need and expense for designing a custom die as conventionally practiced. Accordingly, the time and cost to market is greatly reduced.

Figure 2:
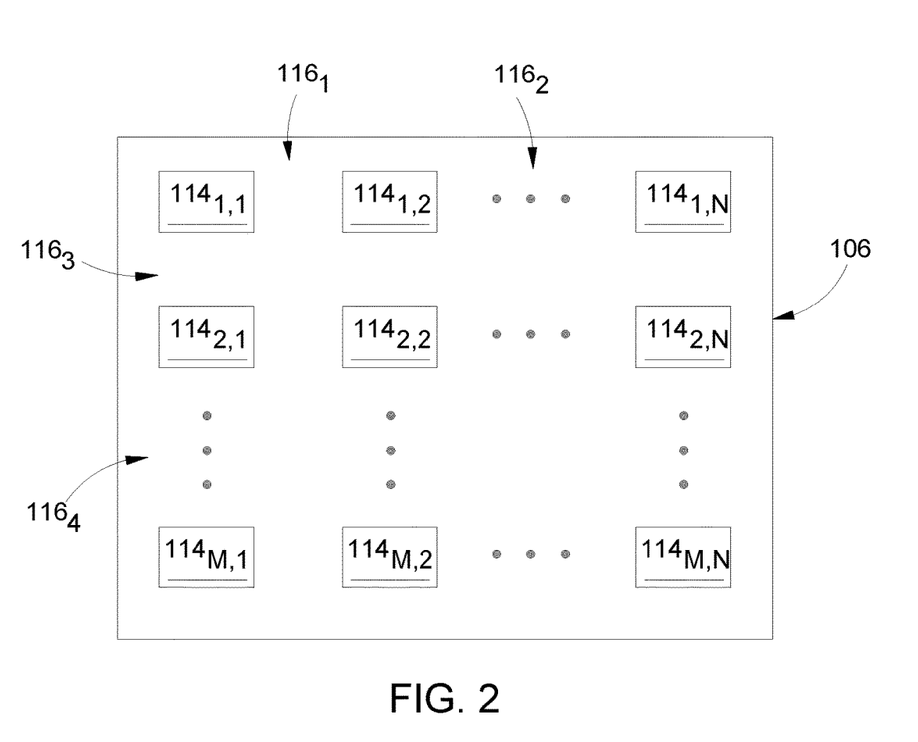
FIG. 2 is a top view of one example of the first wafer segment depicted in FIG. 1.

Referring now to a top view of the wafer segment 106 depicted in FIG. 2, the wafer segment 106 includes the plurality of dice 114 arranged in a grid array. Each wafer segment 106 also includes at least one scribe lane 116. Conventionally, every wafer and wafer segment would be diced along all the scribe lanes so that each and every complete die is individually separated from neighboring dice. In contrast, each wafer segment 106 utilized in the package assembly 110 includes dice 114 that are not separated across the scribe lane 116. The dice 114 may be arranged in a grid pattern or have another pattern. The wafer segment 106 of FIG. 2 is shown with an array of die 114 disposed in N rows and M columns. N and M are positive integers representing the number of dice 114 in a row or column, with at least one of N or M equal or greater than 2. Thus, the grid pattern of dice 114 may be disposed in a 1×2 grid pattern, a 1×3 grid pattern, a 2×2 grid pattern, a 2×3 grid pattern, a 3×3 grid pattern, or other N×M desired grid pattern.

As shown in FIG. 2, each die 114 of the wafer segment 106 is spaced from an adjacent die 114 by the scribe lane 116. For example, die $114_{1,1}$ is spaced from die $114_{1,2}$ by scribe lane $116_1$, die $114_{1,2}$ is spaced from die $114_{1,M}$ by scribe lane $116_2$, die $114_{1,1}$ is spaced from die $114_{2,1}$ by scribe lane $116_3$, and die $114_{1,2}$ is spaced from die $114_{2,2}$ by scribe lane $116_3$.

Figure 3:
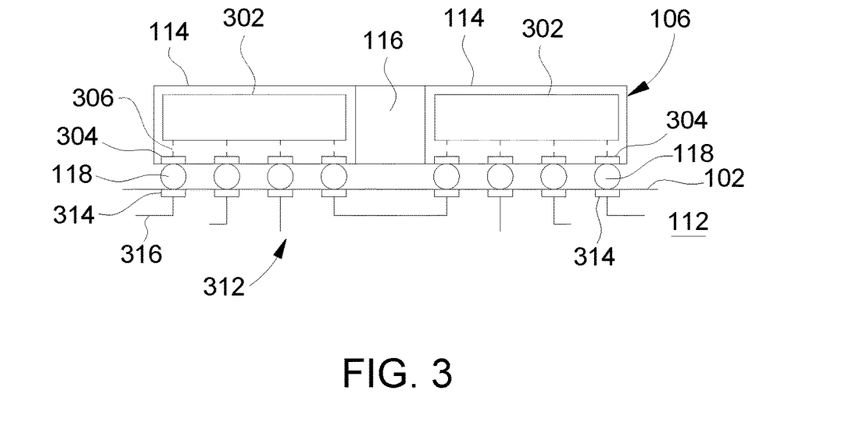
FIG. 3 is a partial side view of the first wafer segment depicted in FIG. 1 coupled to an interconnect substrate.

Referring now to the partial sectional view of FIG. 3, each die 114 of the wafer segment 106 includes solid-state circuitry 302 (shown in phantom). The solid-state circuitry 302 may be configured as at least one of a processor, memory or other circuits that enable the functionality of the die 114. For example, the solid-state circuitry 302 may be configured as DRAM or other memory configuration. In another example, the solid-state circuitry 302 may be configured as a field programmable gate array (FPGA) that includes a large number of different programmable tiles. The programmable tiles include at least one or more of multi-gigabit transceivers ("MGTs"), configurable logic elements ("CLEs"), random access memory blocks ("BRAMs"), input/output blocks ("IOBs"), configuration and clocking logic ("CONFIG/CLOCKS"), digital signal processing blocks ("DSPs"), specialized input/output blocks ("I/O") (e.g., configuration ports and clock ports), and other programmable logic such as digital clock managers, analog-to-digital converters, system monitoring logic, and so forth. Some FPGAs also include dedicated processor blocks ("PROC"). The solid-state circuitry 302 when configured as an FPGA provides high-performance, low-power programmable logic and may include one or more of logical function generators such as look up tables (LUTs), storage elements, distributed memory and shift register logic (SRL), and multiplexers, and carry logic. The storage elements may include a description of and controls for the latches and flip-flops. Dedicated storage elements can be configured as flip-flops or latches with flexible control signals. The carry logic may include dedicated gates that can be cascaded to implement efficient arithmetic functions. The above are just some examples of the many configurations of the solid-state circuitry 302 that may be present within the IC die 114.

In one example, each IC die 114 comprising the wafer segment 106 are identical. In other examples, at least one IC die 114 comprising the wafer segment 106 is different than another IC die 114 of the wafer segment 106.

Figure 4:
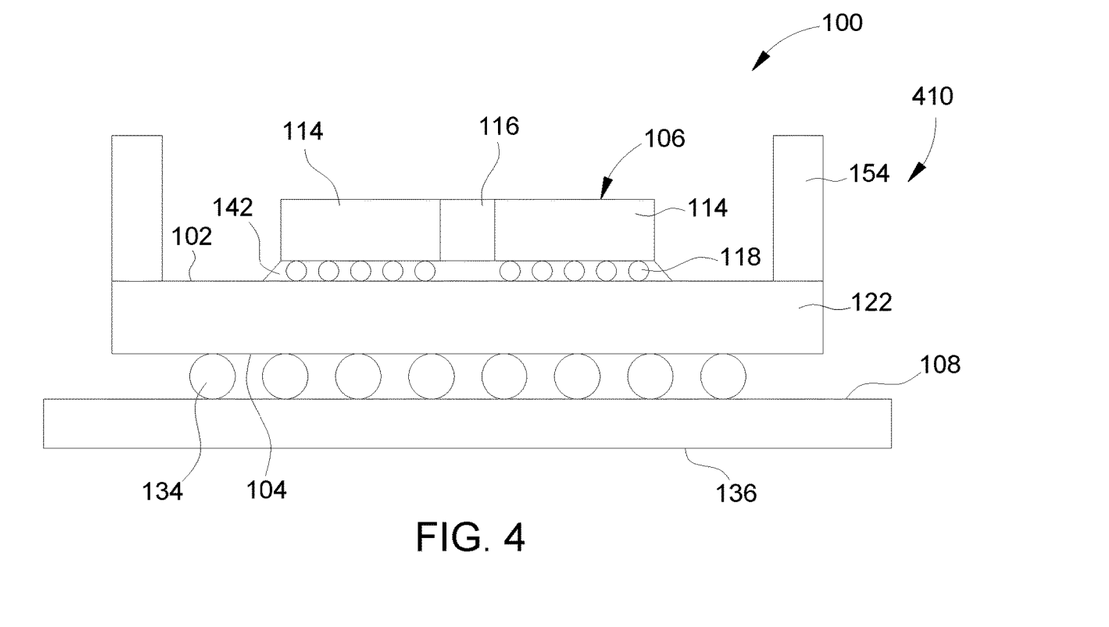
FIG. 4 is a partial side view of another wafer segment coupled to an interconnect substrate.

The solid-state circuitry 302 is coupled by conductors 306 (shown in phantom) to contact pads 304 formed on a bottom surface of the die 114. The contact pads 304 of the die 114 face contact pads 314 formed on a top surface of the interconnect substrate, shown in FIG. 3 as the I/O die 112. The contact pads 314 of the I/O die 112 are connected by conductive routing 316 that comprise circuitry 312 of the I/O die 112. The circuitry 312 of the I/O die 112 is formed by metal interconnect layers forming the I/O die 112. The circuitry 312 of the I/O die 112 terminates on contact pads (not shown in FIG. 3) exposed on the bottom surface of the I/O die 112. The die connections 118 electrically and mechanically connect the solid-state circuitry 302 of the die 114 to the circuitry 312 of the I/O die 112. Thus, die connections 118 also electrically and mechanically connect the solid-state circuitry 302 of wafer segment 106 to the circuitry 312 of the I/O die 112. Through the circuitry 312 of the I/O die 112 and package substrate 122, the solid-state circuitry 302 of the die 114 is coupled to circuitry of the PCB 136. Although dice 114 of the wafer segment 106 may be connect through the circuitry 312 of the I/O die 112, the solid-state circuitry 302 of each of die 114 of the wafer segment 106 is not connected to another die 114 of the wafer segment 106 via conductors disposed on or formed in the scribe lane 116. As discussed above, the I/O die 112 illustrated in FIG. 3 may be omitted, and the dice 114 of the wafer segment 106 may be mounted directly to the package substrate 122, as illustrated in FIG. 4.

Figure 5:
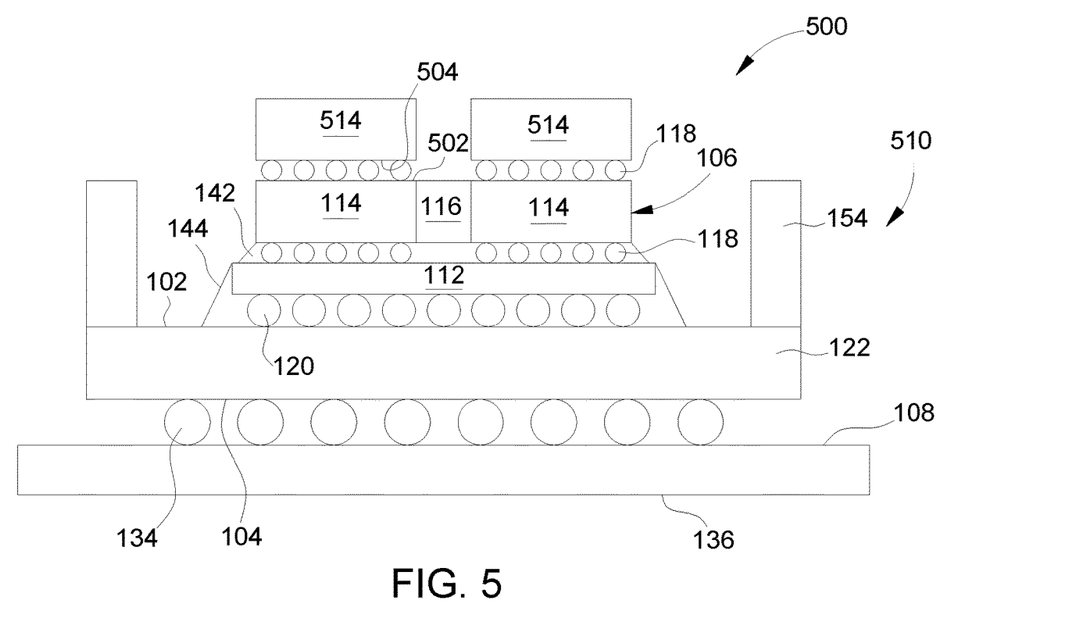
FIGS. 5-7 are front schematic views of different integrated chip package assemblies having at least a first wafer segment that includes at least two dice.
Figure 6:
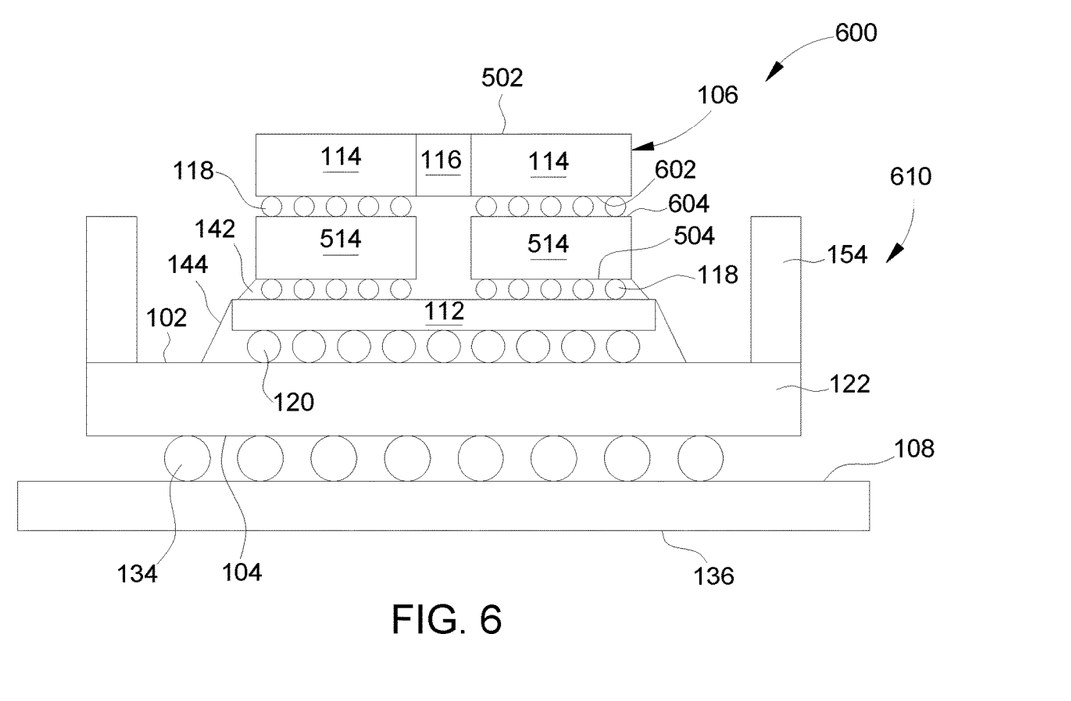
Figure 7:
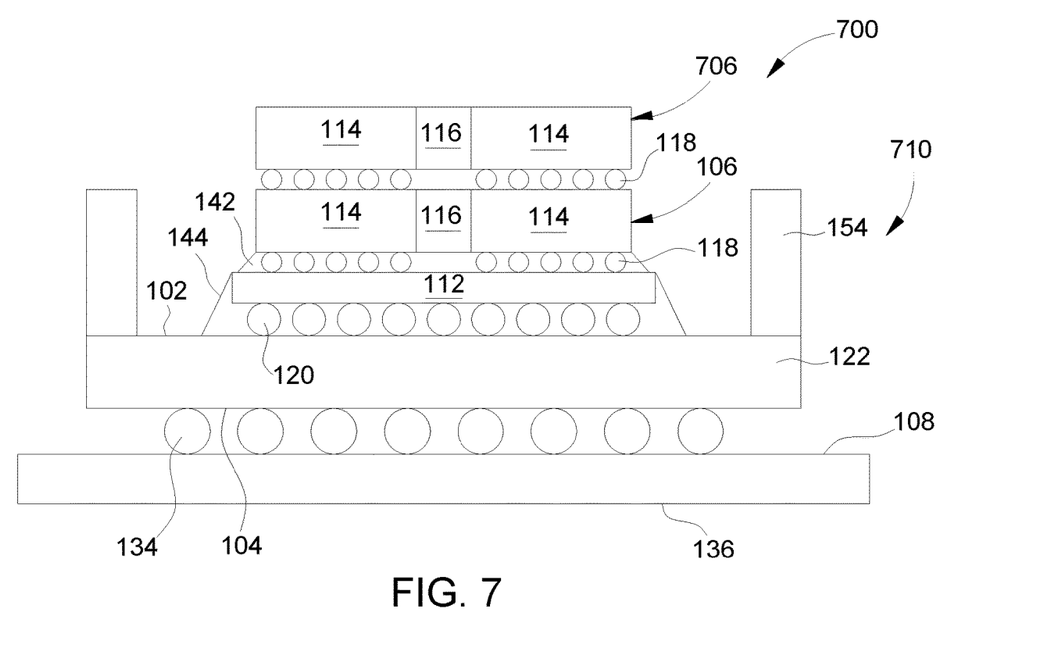

FIGS. 5-7 are front schematic views of different examples of integrated chip packages having stacked dice. In the examples depicted in FIGS. 5-7, the chip package assemblies include at least one die stacked with at least one wafer segment. Turning first to FIG. 5, an electronic device 500 is illustrated that includes a chip package assembly 510 mechanically and electrically connected to a PCB 136 by solder balls 134. The chip package assembly 510 has at least a first wafer segment 106 that includes at least two dice 114. The first wafer segment 106 may be configured as described above with reference to FIGS. 1-4. For example, the first wafer segment 106 is shown mechanically and electrically connected to an interconnect substrate, shown as the I/O die 112, by die connections 118. Alternatively, the first wafer segment 106 may be mechanically and electrically connected to an interconnect substrate configured as a package substrate 122 by die connections 118.

At least one or more diced die 514 is mechanically and electrically connected to the first wafer segment 106 through die connections 118. As utilized herein, a diced die 514 is a die which has been detached from all other dice by dicing a die-containing wafer along the scribe lanes bounding all sides of the die 514 such that each diced die 514 is a single, independent and unitary die. In the embodiment depicted in FIG. 5, two diced dice 514 are mounted on the first wafer segment 106.

For example, contact pads exposed on a bottom surface 504 of the diced die 514 are mechanically and electrically connect by die connections 118 to contact pads exposed on a top surface 502 of the wafer segment 106. The contact pads of the diced die 514 are coupled to the solid-state circuitry formed in the die 514. The solid-state circuitry and contact pads of the diced die 514 are similar to the solid-state circuitry of the die 114. In this manner, the solid-state circuitry of the diced die 514 is electrically and contact pads connected to the solid-state circuitry 302 of the die 114. In the embodiment depicted in FIG. 5, the solid-state circuitry of a first diced die 514 is electrically and mechanically connected to the solid-state circuitry 302 of one die 114 of the first wafer segment 106, while the solid-state circuitry of a second diced die 514 is electrically and mechanically connected to the solid-state circuitry 302 of another die 114 of the first wafer segment 106. The diced dice 514 are separated by an air gap or molding, such as the molding 142 illustrated in FIG. 1.

FIG. 6 is a schematic front view of another example of an electronic device 600. The electronic device 600 includes a chip package assembly 610 that is mechanically and electrically connected to a PCB 136 by solder balls 134. The chip package assembly 610 has at least a first wafer segment 106 that includes at least two dice 114. The first wafer segment 106 may be configured as described above with reference to FIGS. 1-4, except wherein the first wafer segment 106 is separated from an interconnect substrate by at least one diced die 514. For example, diced dice 514 are shown mechanically and electrically connected to an interconnect substrate, shown as an I/O die 112 by die connections 118, while the first wafer segment 106 is stacked on the diced dice 514. Alternatively, the diced dice 514 may be mechanically and electrically connected to an interconnect substrate configured as a package substrate 122 by die connections 118, while the first wafer segment 106 is stacked on the diced dice 514.

At least one first wafer segment 106 is mechanically and electrically connected to the diced die 514 through die connections 118. For example, contact pads exposed on a bottom surface 602 of the wafer segment 106 are mechanically and electrically connect by die connections 118 to contact pads exposed on top surfaces 604 of the diced dice 514. The contact pads of each diced die 514 are coupled to the solid-state circuitry formed in the die 514. The solid-state circuitry and contact pads of the diced die 514 are similar to the solid-state circuitry and contact pads of the die 114. In this manner, the solid-state circuitry of the diced die 514 is electrically connected to the solid-state circuitry 302 of the die 114. In the embodiment depicted in FIG. 6, the solid-state circuitry of a first diced die 514 is electrically and mechanically connected to the solid-state circuitry 302 of one die 114 of the first wafer segment 106 and to the circuitry of the I/O die 112, while the solid-state circuitry of a second diced die 514 is electrically and mechanically connected to the solid-state circuitry 302 of another die 114 of the first wafer segment 106 and to the circuitry of the I/O die 112.

FIG. 7 is a schematic front view of another example of another electronic device 700. The electronic device 700 includes a chip package assembly 710 that is mechanically and electrically connected to a PCB 136 by solder balls 134. The chip package assembly 710 includes at least a first wafer segment 706 that is stacked on a second wafer segment 106. Each of the first and second wafer segments 706, 106 includes at least two dice 114. The first and second wafer segments 706, 106 may be configured as described above with reference to FIGS. 1-4. The first and second wafer segments 706, 106 may be identically configured, for example, by having the same number, type and arrangement of dice 114. In an alternative example, the first and second wafer segments 706, 106 may have different configurations, for example, by having one or more of the number, type and arrangement of dice 114 being different between the segments 706, 106. Although only two wafer segments 706, 106 are shown stacked in the embodiment of FIG. 7, the number of stacked wafer segments may be more than two. Optionally, the chip package assembly 710 may include at least one diced die 514 disposed between the second wafer segment 106 and the interconnect substrate; one or more dice die 514 stacked on the first wafer segment 706; and one or more dice die 514 disposed between the second wafer segment 106 and the first wafer segment 706. In the example depicted in FIG. 7, the first and second wafer segments 706, 106 are identical.

In the example depicted in FIG. 7, the dies 114 of the first wafer segment 706 are shown mechanically and electrically connected to the dies 114 of the second wafer segment 106. The dies 114 of the second wafer segment 106 are shown mechanically and electrically connected to circuitry of an interconnect substrate, shown as an I/O die 112, by die connections 118. Alternatively, the dies 114 of the second wafer segment 106 may be mechanically and electrically connected to an interconnect substrate configured as a package substrate 122 by die connections 118, while the first wafer segment 706 is stacked on the second wafer segment 106.

As illustrated in FIG. 7, a first die 114 of the second wafer segment 106 is mechanically and electrically connected to the interconnect substrate (e.g., the I/O die 112) through die connections 118, while also being mechanically and electrically connected to a first die 114 of the first wafer segment 706. For example, contact pads exposed on a bottom surface of the first wafer segment 706 are mechanically and electrically connect by die connections 118 to contact pads exposed on a top surface of the second wafer segment 106. The contact pads of the first wafer segment 706 are coupled to the solid-state circuitry formed in the dice 114 of the first wafer segment 706. The solid-state circuitry and contact pads of the dice 114 of the first wafer segment 706 are similar to the solid-state circuitry and contact pads of the die 114 of the second wafer segment 106. In this manner, the solid-state circuitry 302 of a first die 114 of the first wafer segment 706 is electrically connected to the solid-state circuitry 302 of a first die 114 of the second wafer segment 106. Similarly, the solid-state circuitry of a second die 114 of the first wafer segment 706 is electrically and mechanically connected to the solid-state circuitry 302 of a second die 114 of the second wafer segment 106.

The chip package assemblies describe above may be fabricated utilizing a variety of techniques. For example, a die-containing wafer may be diced along selective first scribe lanes, while not separating dice formed on either side of another scribe lane, thus yielding wafer segments having at least two dice spaced by a scribe lane. These wafer segments may be selected for assembly into the chip package assembly has needed according to design requirements. The chip package assembly may include a single wafer segment stacked on an I/O substrate or package substrate. The chip package assembly may include a wafer segment stacked with one or more additional wafer segments or diced dice. An exemplary method for fabricating such chip package assemblies is provided below.

Figure 8:
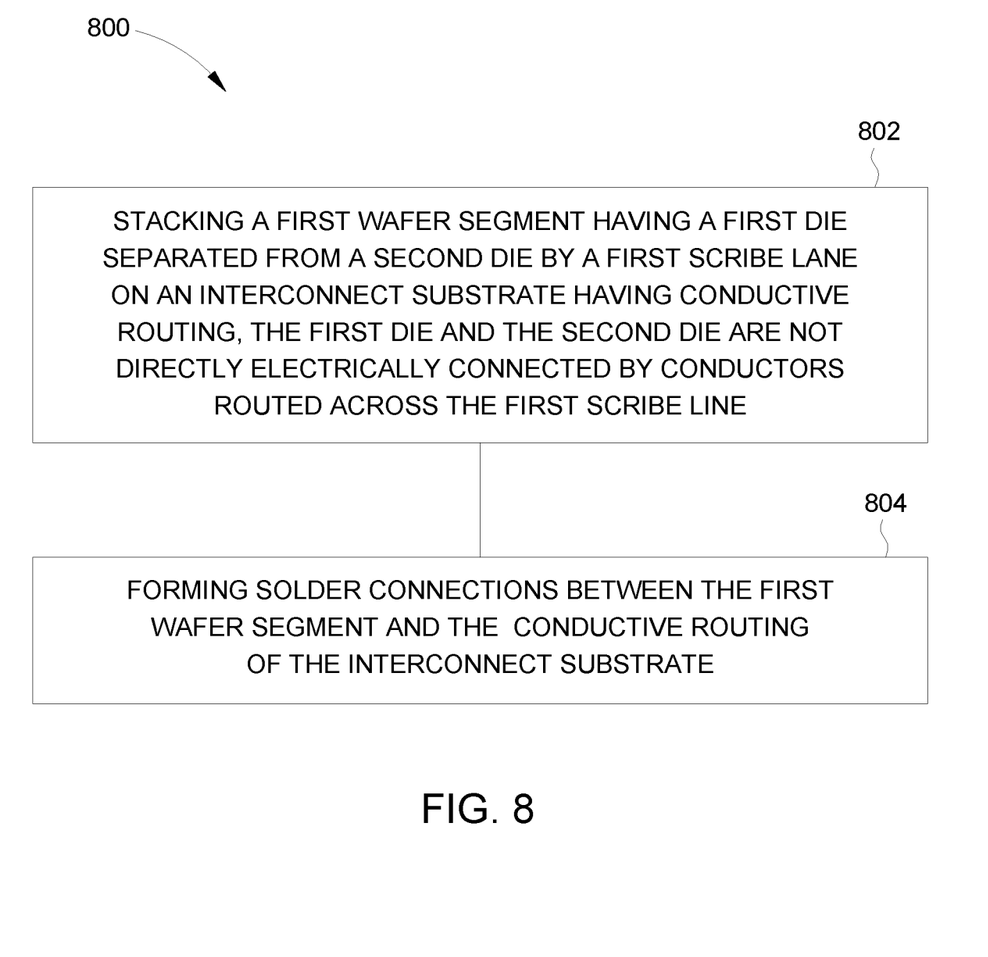
FIG. 8 is a block diagram of one example of a method for forming a chip package assembly having a first wafer segment that includes at least two dice.

FIG. 8 is a block diagram of one example of a method for forming a chip package assembly having a first wafer segment that includes at least two dice. The chip package assembly may be configured as described above with reference to FIGS. 1-7.

The method 800 begins at operation 802 by stacking a first wafer segment having a first die spaced from a second die by a first scribe lane on an interconnect substrate having conductive routing (e.g., interconnect circuitry). The first die and the second die forming the first wafer segment are not directly electrically connected by conductors routed across first the scribe lane. The interconnect substrate may be an I/O die, interposer or a package substrate.

The method 800 continues at operation 804 by forming solder connections between the first wafer segment and the conductive routing of the interconnect substrate. The solder connections are subjected to a reflow process to reflow solder in the solder connections to electrically connect the IC dice 114 to the interconnect substrate. The reflow process may be performed in a conveyor oven or using other suitable technique.

Optionally, the diced dies may be stacked immediately on or immediately below the first wafer segment. Optionally, one or more wafer segments may be stacked immediately the first wafer segment.

Thus, as described above, the use of modular wafer segments having core dies within the chip package assembly substantially reduces the cost of design and manufacture. Additionally, the low cost interconnect substrate provides efficient communication with the wafer segment(s) without adding significant expense. The modular wafer segments and low cost interconnect substrates of the chip package assemblies describe herein dramatically reduces the need for custom design and tapeouts, while also dramatically reducing the time to manufacture the chip package assembly at a significant reduction in cost.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
    a first wafer segment having a first die spaced from a second die by a first scribe lane, sidewalls of the first die, the second die, and the first scribe lane physically contact by silicon of the first wafer segment;
    an interconnect substrate stacked below the first wafer segment, the interconnect substrate having conductive routing electrically connected to the first die and the second die through die connections; and
    a first diced die mechanically and electrically connected to the first die through die connections, wherein the first diced die is detached from all other dice along the scribe lanes bounding all sides of the first diced die such that first diced die is a single, independent and unitary die.

2. The chip package assembly of claim 1, wherein the first die and the second die are not directly electrically connected by conductors routed across the first scribe lane of the first wafer segment.

3. The chip package assembly of claim 1, wherein the first wafer segment further comprises:
    a third die separated from the first die by a second scribe lane.

4. The chip package assembly of claim 3, wherein the first wafer segment further comprises:
    a fourth die separated from the second die by the first scribe lane.

5. The chip package assembly of claim 4, wherein the third die and the fourth die are not directly electrically connected by conductors routed across first scribe lane; and the third die and the first die are not directly electrically connected by conductors routed across second scribe lane.

6. The chip package assembly of claim 1 further comprising:
    a second wafer segment stacked on the first wafer segment, the second wafer segment having a first die spaced from a second die by a scribe lane, the first die of the first wafer segment electrically and mechanically coupled to the first die of the second wafer segment by die connections, and the second die of the first wafer segment electrically and mechanically coupled to the second die of the second wafer segment.

7. The chip package assembly of claim 6, wherein a number of dice comprising the second wafer segment is equal to a number of dice comprising the first wafer segment.

8. The chip package assembly of claim 1, wherein the interconnect substrate is an I/O die that is mechanically connected to the first wafer segment via the die connections.

9. The chip package assembly of claim 8 further comprising:
    a package substrate stacked below the I/O die, the package substrate electrically and mechanically coupled to the I/O die by die connections.

10. The chip package assembly of claim 1, wherein the first die and the second die are different.

11. The chip package assembly of claim 6, wherein the first and second wafer segments have the same number, type and arrangement of dice.

12. The chip package assembly of claim 6, wherein the first and second wafer segments have one or more of a different number, type and arrangement of dice.

13. The chip package assembly of claim 1, wherein the first diced die is disposed between the interconnect substrate and the first wafer segment.

14. The chip package assembly of claim 1, wherein the first wafer segment is disposed between the interconnect substrate and the first diced die.

15. The chip package assembly of claim 6, wherein the first die and the second die are different.

16. The chip package assembly of claim 6, wherein the first and second diced dice are disposed between the interconnect substrate and the first wafer segment.

17. The chip package assembly of claim 6, wherein the first wafer segment is disposed between the interconnect substrate and the first and second diced dice.

18. A chip package assembly comprising:
    a first wafer segment having a first die spaced from a second die by a first scribe lane, sidewalls of the first die, the second die, and the first scribe lane physically contact by silicon of the first wafer segment;
    an interconnect substrate stacked below the first wafer segment, the interconnect substrate having conductive routing electrically connected to the first die and the second die through die connections;
    a first diced die mechanically and electrically connected to the first die through die connections; and
    a second diced die mechanically and electrically connected to the second die through die connections, the first and second diced dice lateral separated by an air gap or molding, wherein the first and second diced dies each are detached from all other dice along the scribe lanes bounding all sides of the first and second diced dies such that first and second diced dies each is single, independent and unitary die.

* * * * *